United States Patent [19]

Laudermilch

[11] Patent Number: 4,587,492
[45] Date of Patent: May 6, 1986

[54] THERMAL BARRIER FOR VARIABLE TEMPERATURE NMR

[75] Inventor: John R. Laudermilch, Foster City, Calif.

[73] Assignee: Varian Associates, Inc., Palo Alto, Calif.

[21] Appl. No.: 585,943

[22] Filed: Mar. 2, 1984

[51] Int. Cl.$^4$ .......................................... G01R 33/00
[52] U.S. Cl. ................................................. 324/318
[58] Field of Search ............... 324/300, 307, 313, 315, 324/318–321

[56] References Cited

U.S. PATENT DOCUMENTS 4,180,769 12/1979 Gang .................................... 324/319
4,240,033 12/1980 Anderson et al. ................... 324/321

FOREIGN PATENT DOCUMENTS 1196820 7/1970 United Kingdom ................ 324/321
960599 9/1982 U.S.S.R. .............................. 324/307

Primary Examiner—Reinhard J. Eisenzopf
Assistant Examiner—Kevin D. O'Shea
Attorney, Agent, or Firm—Stanley Z. Cole; Edward H. Berkowitz

[57] ABSTRACT

An NMR system for obtaining high resolution spectroscopic measurements at a selected temperature includes gradient correcting means disposed in proximity to an NMR probe, for imposing desired gradients on the volume occupied by the sample within the probe. A heat exchange gas is impelled through a heat exchanger and then surrounds the sample to bring the sample to the desired temperature. A thermal barrier, inocuous to RF excitation and of relatively low magnetic susceptibility protects the gradient correcting means from drift due to heat exchange with the heat exchanging gas.

6 Claims, 4 Drawing Figures

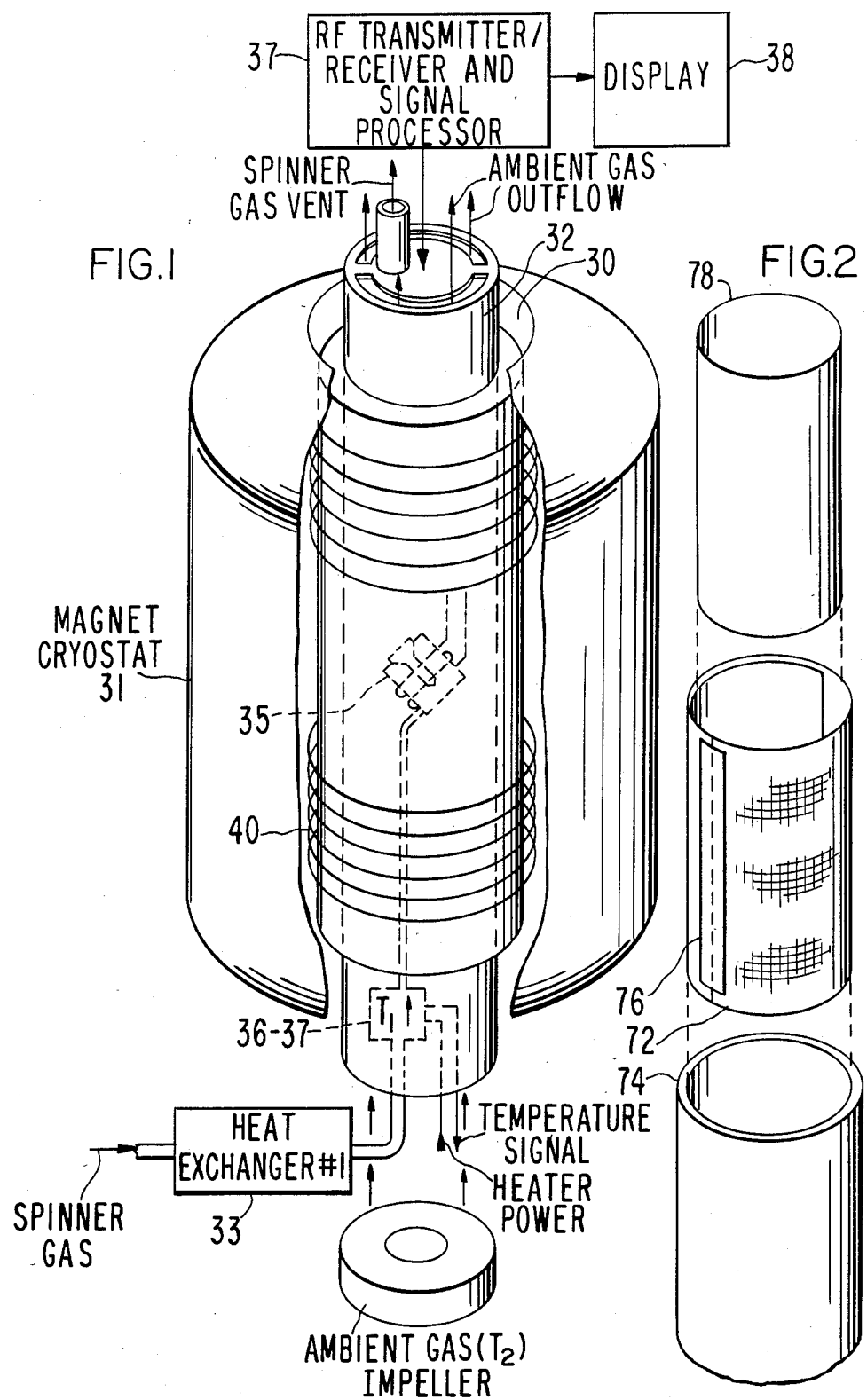

THERMAL BARRIER FOR VARIABLE TEMPERATURE NMR

FIELD OF THE INVENTION

The invention is in the general area of NMR spectrometer probe structure and relates particularly to practice of NMR spectroscopy at selectable temperatures.

BACKGROUND OF THE INVENTION

The ability to selectably vary the temperature of a sample during NMR analysis is a known technique for the enhancement of NMR signal characteristics and resulting spectra. Apparatus to accommodate selectable temperature NMR analysis is known in the prior art, frequently in the form of a dewar constructed for disposition within the NMR probe, and thus subject to severe spatial constraints for location between the poles of a conventional magnet or in the bore of a superconducting magnet. Such apparatus necessarily occupies a substantial portion of the analysis volume, thereby reducing the volume available for the sample. Consequently, dewar-based systems are at a disadvantage in respect to sensitivity by virtue of a reduced sample volume and separately, are characterized by degraded resolution because the larger volume required penalizes the achievable field homogeneity. The latter problem is subject to remedy by imposition of controllable gradient fields carefully designed to cancel out residual inhomogeneities. However, the gradient corrections are achieved with coils which are necessarily disposed as close as possible to the sample region. To the extent that heat developed or absorbed in the sample volume may affect the surrounding gradient correction coils, the gradient correction suffers and resolution is reduced.

Dewar systems suffered further disadvantages. The dimensional contraints result in a somewhat fragile component. Mechanical handling of the probe assembly and disassembly of portions of the probe are routine operations. Mechanical spinning and sample ejection are also sources of possible mechanical malfunction wherein the dewar may suffer damage. Dewar integrity includes the vacuum integrity of the dewar vessel. It is apparent that the dewar is a non-trivial expense item in ordinary operation.

The dewar is also subject to RF fields which may induce electrical breakdown within the dewar vacuum vessel resulting in substantial further RF noise detrimental to the resonance signal processing.

BRIEF DESCRIPTION OF THE INVENTION

Selectable temperature operation is achieved by forming a thermal barrier around the sample space within the NMR probe and circulating a controlled termperature gas therethrough. The thermal barrier is characterized as innocuous in the region of the RF resonant spectrum where the sample is to be studied and in other respects the barrier material ought to exhibit low magnetic susceptibility. In one practical embodiment fiberglass fabric was formed into a cylindrical winding of several layers to form a cylinder of maximal internal diameter for insertion into the cylindrical probe barrel. The inner surface of the fabric was then protected from mechanical contact with internal probe components by a layer of sheet Teflon disposed on the inner surface of the fiberglass fabric cylinder, which also helps maintain the cylindrical form. Fiberglass adhesive is used to hold the assembly together. A flow of room temperature gas is maintained through the probe body inside the fibreglass thermal barrier forming a sheath around the specific sample containment region.

BRIEF DESCRIPTION OF THE DRAWINGS

FIG. 1 schematically represents a typical NMR spectrometer.

FIG. 2 shows a relationship of gradient coils, probe barrel and thermal barrier of the present invention.

DETAILED DESCRIPTION OF THE INVENTION

Figure 3A:
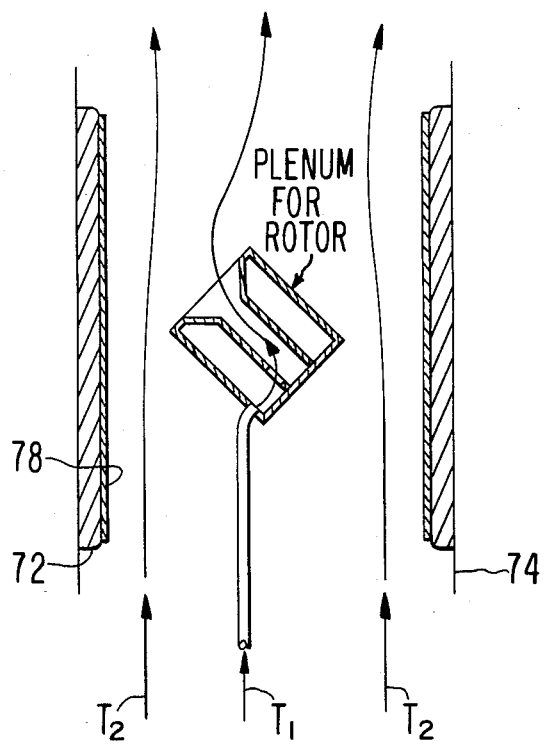
FIG. 3A shows a thermal gas sheath.
Figure 3B:
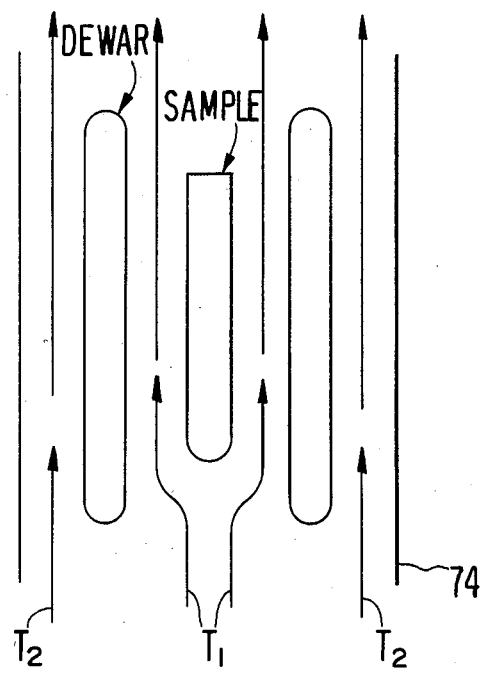
FIG. 3B shows a thermal gas sheath for a dewar based probe.

The context of the present invention is that of an NMR spectrometer for which the schematic description of FIG. 1 is indicative of the features pertinent to the invention. The spectrometer of FIG. 1 includes a high field superconducting magnet located within cryostat 31 with a bore 30 in which a probe 32 is located. A heat exchanger 33 is arranged to cool a gas flow introduced for a generally axial flow through the probe to maintain the temperature of the sample 35 at a desired temperature which is monitored by temperature sensor 36. Temperature sensor 36 controls further heat exchanger 37 to warm the spinner gas to the desired temperature. The gas flow is introduced for threefold purposes; as indicated, to maintain a selected temperature; to drive a spinner apparatus for rotating the sample; and to eject the sample from the probe. An RF transmitter/receiver and signal processor 37 is connected to the probe 32, which probe includes coils, not shown, for exciting detecting resonance spectra of the sample. The signal processor also includes means for displaying the spectrum of the sample under examination as indicated symbolically by display means 38. Magnetic gradient windings indicated symbolically at 40 are disposed in proximity to the sample to compensate residual gradients in the magnetic field in the sample volume. Although the above referenced FIG. 1 features a superconducting main magnet, the present invention is not limited thereto and a room temperature magnet does not affect the nature of the invention.

The bore of the superconducting main magnet cryostat contains a number of gradient correcting magnetic windings as indicated above. These are frequently realized as printed circuits on a flexible substrate, such as mylar. Flexible substrate is then formed into an annular surface for insertion into the bore. The interior space of the bore is available to receive the probe. For a selectable temperature probe (in this case for said samples), heating or cooling elements operate on an air flow which is then forced through the probe housing. Temperatures in the range from minus 50° C. to plus 100° C. are accesible and desirable for experimental conditions and the sample can therefore be maintained at a desired temperature T±1° C. by operation of a temperature sensor. Temperature control is well known and need not be further discussed for the present purposes.

The consequence of the thermal regime here described is that the gradient correcting coils are grossly affected by the ambient thermal disturbance. The gradient corrections are designed to precisely compensate deviations from a desired field distribution. A typical magnetic field is required to be uniform within the sample region to 1 part in $10^{-7}$ and free of gradients to 8th word. Such a magnet requires gradient fields which are precise and controllable to the required orders to be applied to cancel the residual gradients. Such a corrected magnet system is described in part in U.S. Pat. No. 4,180,769, commonly assigned. The gradient correction apparatus must obviously be stable to a corresponding precision. The thermal transfer to/from ambient temperature gradient windings affects the DC resistivity thereof and the precise gradient correction suffers.

The present invention is primarily intended to provide means for maintaining the sample volume at a constant controlled temperature without dimensional and other disadvantages characteristic of sample dewar structure.

A further advantage of the present invention is evident in creating a thermal barrier between gradient coils and the sample. This advantage is again emphasized by lack of available space in which to maintain a dewar structure, and further, by a need to maintain this sensitive volume free of RF signal sources and preferably free of contrasting magnetic susceptibilities.

FIG. 2 shows the provision of a glass fiber cloth thermal barrier. The volume magnetic susceptibility of glasses, in particularly the material commonly provided as a woven fiber material, is approximately $1.2 \times 10^{-6}$. Glass fiber woven material is rolled to form a cylinder 72 for insertion in probe barrel 74. The inner diameter, e.g. diameter inside room temperature shim coils, for one typical high resolution (narrow bore) superconducting magnet spectrometer (Varian XL-300) is 45 millimeters. In one typical embodiment 3 layers (turns) of the woven fiber occupying approximately 0.5 mm of the 21 mm inside bore radius of the probe body, are formed and secured by a strip of glass fiber adhesive 76. In order to protect the inner surface of the glass fiber material from abrasion by internal components of the probe during removal or insertion of the probe barrel 74, a further protective layer of a suitable material, such as Teflon sheet (10 mils), is similarly formed into a cylinder 78 for insertion within the thermal barrier cylinder 72.

Temperature maintenance is accomplished by circulating the spinner gas through a first heat exchanger immersed in $LN_2$, lowering the temperature of the spinner gas to base temperature and impelling the gas through a second heat exchanger to bring the gas to a desired temperature $T_1$, then further flowing the heated gas past the sample in the course of driving the rotor containing the sample. A thermal sensor, upstream from the sample, senses gas temperature and provides a proportional signal for comparison with a selectable reference to provide temperature control in standard fashion. When sample temperature above ambient is desired, the first heat exchange step is omitted. Room temperature $T_2$ gas is caused to flow around the outside of the rotor assembly to create a thermal gradient between the probe barrel and the sample with a thermally protective sheath of gas. The sheath gas flow is shown schematically in FIG. 3A for a solid sample probe as described and contrasted with a known liquid sample dewar probe arrangement. The gas flow at temperature $T_1$ is the thermally controlled gas, whereas the sheath gas at temperature $T_2$ provides the additional thermal barrier. A thick fiberglass blanket comprising 19 layers of fiberglass and 1 layer of Teflon forming a cylinder of 1.1 mm thick, conforming to the inner surface of the probe barrel (42.5 mm inside diameter) was formed for comparative measurements. Temperature measurements inside and outside (ambient) the probe housing were monitored for extremes of the sample temperature range. The measurements were also carried out for a thin blanket of 6 layers of fiberglass and 1 layer of Teflon forming a cylinder 0.5 mm thick. At a sample volume temperature of 98.0° C. the outside of the probe barrel as 40.5° C. and 40.6° C. for the thick and thin blankets respectively. At a sample volume temperature of −50.3° C. thick blanket isolation yielded +11.3° C. outside the probe barrel.

It will be apparent that many changes can be made in the above method and apparatus and manyapparently different embodiments of this invention can be made without departing from the scope thereof; it is therefore intended that all matter contained in the above description and shown in accompanying drawings shall be interpreted as illustrative and not in a limiting sense.

What is claimed is:

1. An NMR system for high resolution spectroscopic measurements of a sample at a selectable temperature comprising:
   (a) polarizing magnet means for imposing a substantially homogeneous magnetic field throughout the volume occupied by said sample,
   (b) gradient correcting magnet means disposed peripherally with respect to said sample for imposing desired magnetic field gradients in the volume occupied by said sample,
   (c) fluid impelling means for causing a heat exchanging fluid to flow in heat exchanging relationship with said sample, plenum means for constraining said fluid about said sample, thermal sensor means for generating a signal proportional to the temperature of said heat exchange fluid in the environs of said sample and heat exchange means for bringing said fluid to a desired temperature,
   (d) probe means comprising a probe housing for supporting said sample and for introducing said heat exchange fluid to flow in thermal communication with said sample,
   (e) solid thermal barrier means disposed between said flowing heat exchange fluid and said gradient correction means for isolating said gradient correcting magnet means from heat exchange with said heat exchange fluid.

2. The NMR system of claim 1 wherein said thermal barrier means comprises a glass fiber cloth formed into a hollow cylindrical body of maximal diameter congruent with the interior surface of said probe housing.

3. The NMR system of claim 2 wherein said thermal barrier means comprises an annular body of homogeneous material, said material exhibiting a volume susceptibility less than $1.5 \times 10^{-6}$ disposed interiorly of said hollow cylindrical body for protecting the interior surface of said thermal barrier from abrasion.

4. The NMR system of claim 2 or 3 further comprising means for impelling a gas at substantially ambient temperature between said plenum and said thermal barrier means whereby an insulating sheath is formed about said plenum.

5. An NMR system for high resolution spectroscopic measurements of a sample at a selectable temperature comprising:
   (a) polarizing magnet means for imposing a substantially homogeneous magnetic field throughout the volume occupied by said sample, (b) fluid impelling means for causing a heat exchanging fluid to flow in heat exchanging relationship with said sample, thermal sensor means for generating a signal proportional to the temperature of said heat exchange fluid in the environs of said sample and heat exchange means for bringing said fluid to a desired temperature, (c) probe means comprising a probe housing for supporting said sample and for introducing said heat exchange fluid to flow in thermal communication with said sample, (d) solid thermal barrier means disposed between said flowing heat exchange fluid and said polarizing magnet means for isolating said sample from heat exchange with the environment thereof, said thermal barrier means comprising a thermally non-conducting material.

6. The system of claim 5 wherein said thermal barrier comprises glass fiber fabric surrounding said sample and spaced apart therefrom to permit flow of said heat exchange fluid.

* * * * *